United States Patent [19]
Lee

[11] Patent Number: 5,231,605
[45] Date of Patent: Jul. 27, 1993

[54] DRAM COMPRESSED DATA TEST MODE WITH EXPECTED DATA

[75] Inventor: Terry R. Lee, Boise, Id.

[73] Assignee: Micron Technology, Inc., Boise, Id.

[21] Appl. No.: 648,575

[22] Filed: Jan. 31, 1991

[51] Int. Cl.⁵ .................... G11C 7/00; G11C 29/00
[52] U.S. Cl. .................... 365/201; 371/21.2; 371/25.1
[58] Field of Search ............ 365/201; 371/21.2, 25.1

[56] References Cited

U.S. PATENT DOCUMENTS

| | | | |
|---|---|---|---|
| 4,369,511 | 1/1983 | Kimura et al. | 371/21.2 |
| 4,414,665 | 11/1983 | Kimura et al. | 365/201 |
| 4,541,090 | 9/1985 | Shiragasawa | 365/201 |
| 4,654,827 | 3/1987 | Childers | 365/201 |
| 4,752,929 | 6/1988 | Kantz et al. | 365/201 |
| 4,821,238 | 4/1989 | Tatematsu | 365/201 |
| 4,835,774 | 5/1989 | Ooshima et al. | 371/21.2 |
| 4,860,259 | 8/1989 | Tobita | 365/201 |
| 4,932,028 | 6/1990 | Katircioglu et al. | 371/16.5 |
| 4,958,345 | 9/1990 | Fujisaki | 371/25.1 |
| 4,958,346 | 9/1990 | Fujisaki | 371/25.1 |
| 4,974,226 | 11/1990 | Fujimori et al. | 371/22.3 |
| 4,991,139 | 2/1991 | Takahashi et al. | 365/201 |
| 5,075,892 | 12/1991 | Choy | 371/21.2 |
| 5,107,501 | 4/1992 | Zorian | 371/21.3 |

Primary Examiner—Eugene R. LaRoche
Assistant Examiner—Michael C. Kessell
Attorney, Agent, or Firm—Hopkins, French, Crockett, Springer & Hoopes

[57] ABSTRACT

A unique method of testing an integrated circuit DRAM for incorrect stored data is disclosed. A JEDEC test mode entry is initiated by normal means, i.e., Write Enable (WE*) and Column Address Select (CAS*) before Row Address Select (RAS*) with specific address data to select a specific test. Data bits are then loaded in the DRAM cells and column data bits compared. The subarray bits are also compared with bits in an expected data register which has been loaded at the beginning of the read cycle. If column bits match and subarray bits match the expected data register, ones are indicated on the data (out) bus; otherwise, a zero appears in case of a data error.

6 Claims, 5 Drawing Sheets

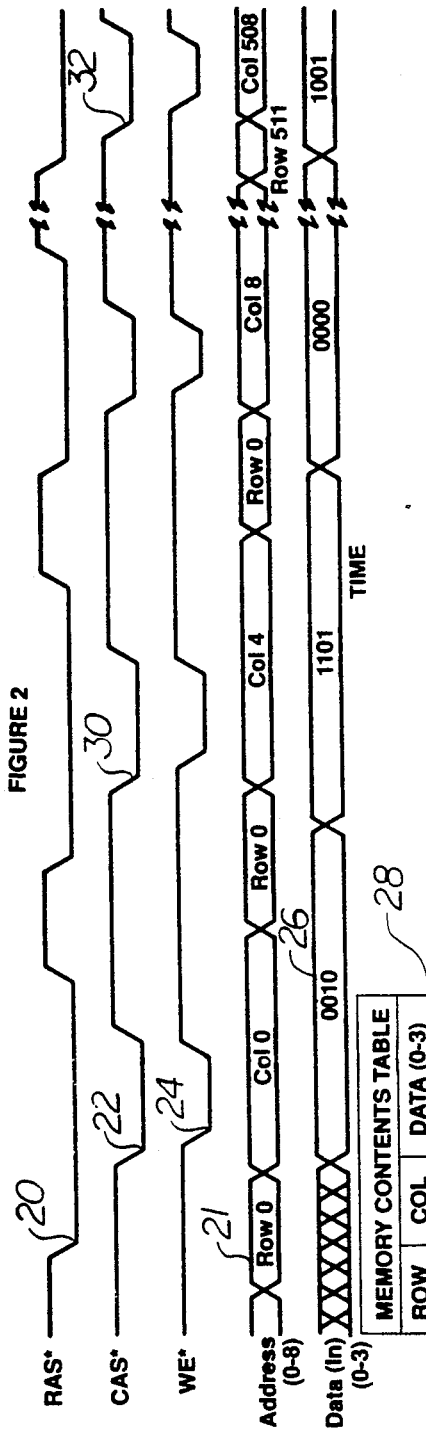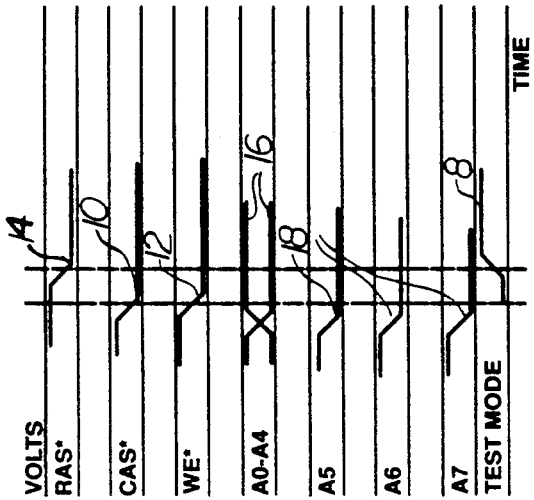

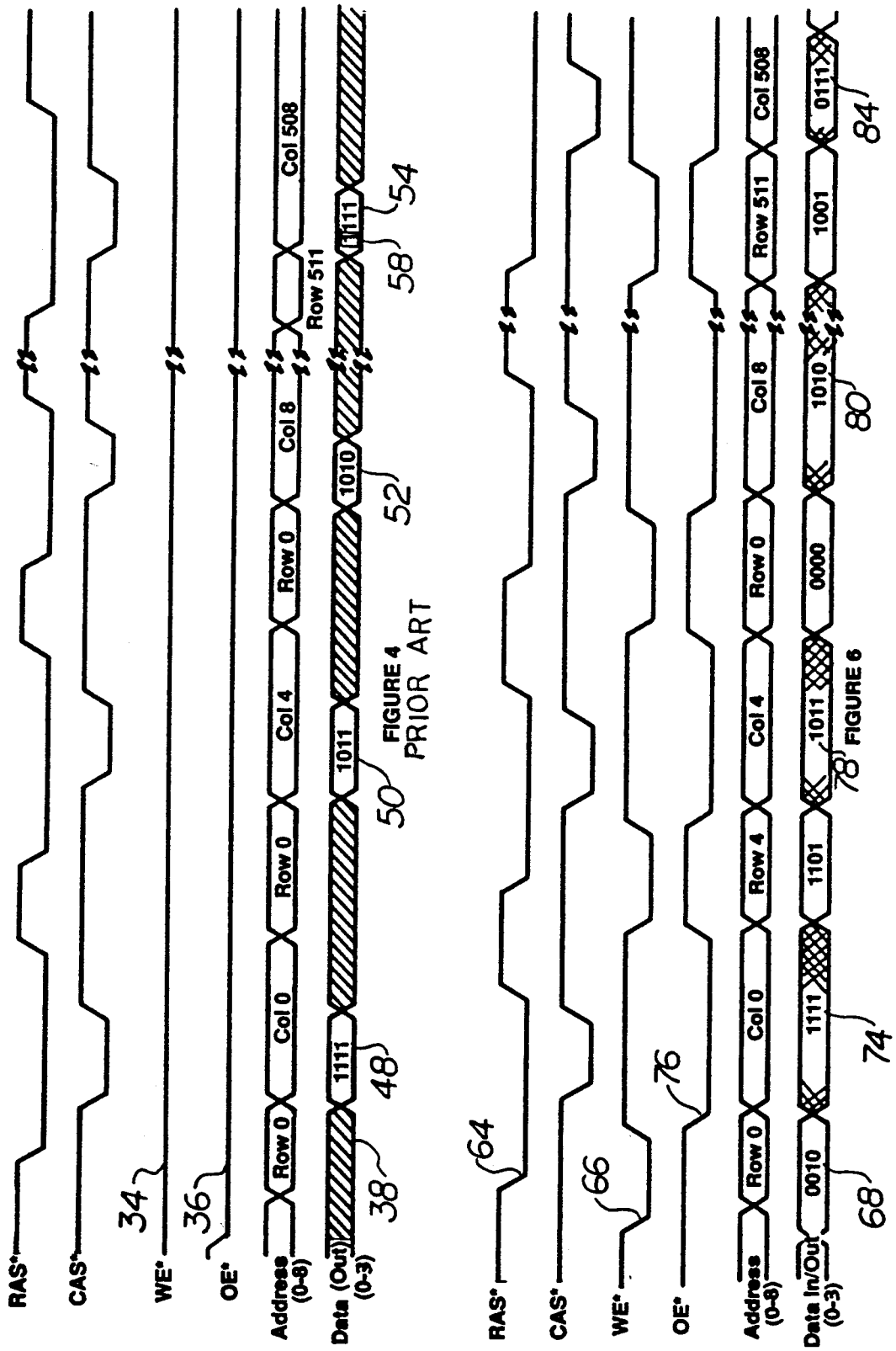

FIGURE 5 PRIOR ART

| MEMORY CONTENTS TABLE | | | | | | |
|---|---|---|---|---|---|---|
| ROW | COL | DATA (0-3) | | | | |
| | | 0 | 1 | 2 | 3 | |
| 0 | 0 | 0 | 0 | 1 | 0 | |
| 0 | 1 | 0 | 0 | 1 | 0 | |
| 0 | 2 | 0 | 0 | 1 | 0 | |
| 0 | 3 | 0 | 0 | 1 | 0 | |
| 0 | 4 | 1 | 1 | 0 | 1 | |
| 0 | 5 | 1 | [0] | 0 | 1 | |
| 0 | 6 | 1 | 1 | 0 | 1 | |
| 0 | 7 | 1 | 1 | 0 | 1 | |
| 0 | 8 | 0 | [0] | 0 | 0 | |
| 0 | 9 | 0 | 1 | 0 | 0 | |
| 0 | 10 | 0 | 0 | 0 | [1] | |
| 0 | 11 | 0 | 0 | 0 | 0 | |
| 511 | 508 | [0 | 0 | 0 | 1] | |
| 511 | 509 | 0 | 0 | 0 | 1 | |
| 511 | 510 | 0 | 0 | 0 | 1 | |
| 511 | 511 | 0 | 0 | 0 | 1 | |

| OUTPUT AFTER DATA COMPARE | | OUTPUT DATA BUS | | | |
|---|---|---|---|---|---|
| ROW | COL. | 0 | 1 | 2 | 3 |
| 0 | 0-3 | 1 | 1 | 1 | 1 |
| 0 | 4-7 | 1 | [0] | 1 | 1 |
| 0 | 8-11 | 1 | [0] | 1 | [0] |
| 511 | 508-511 | 1 | 1 | 1 | 1 |

FIGURE 7

| MEMORY CONTENTS TABLE | | | |
|---|---|---|---|
| ROW | COL | DATA (0-3) | |
| 0 | 0 | 0 0 1 0 | |
| 0 | 1 | 0 0 1 0 | |
| 0 | 2 | 0 0 1 0 | |
| 0 | 3 | 0 0 1 0 | |
| 0 | 4 | 1 1 0 1 | |
| 0 | 5 | 1 [0] 0 1 | |
| 0 | 6 | 1 1 0 1 | |
| 0 | 7 | 1 1 0 1 | |
| 0 | 8 | 0 [1] 0 0 | |
| 0 | 9 | 0 0 0 0 | |
| 0 | 10 | 0 0 0 [1] | |
| 0 | 11 | 0 0 0 0 | |
| 511 | 508 | [0 0 0 1] | |
| 511 | 509 | 0 0 0 1 | |
| 511 | 510 | 0 0 0 1 | |
| 511 | 511 | 0 0 0 1 | |

DRAM COMPRESSED DATA TEST MODE WITH EXPECTED DATA

FIELD OF THE INVENTION

This invention relates to a method of testing a dynamic random access memory (DRAM) using multiple bits (words or bytes) simultaneously and also comparing the bits with stored correct data within an existing register.

BACKGROUND OF THE INVENTION

Dynamic random access memory integrated circuits (DRAM IC's) undergo testing by the manufacturer during production and often by the end user, for example, in a memory test conducted during computer initialization. As DRAM IC densities increase, so that individual DRAM IC's are capable of storing four or more megabits of information, the time necessary for testing the IC's increases as well. To reduce the testing time required, it is known in the art to place the DRAM IC's in a test mode for that purpose, as distinguished from the normal operating mode. In a normal operating mode, a DRAM IC reads and writes one bit at a time. A DRAM IC could be tested in the normal operating mode, but the time required to conduct exhaustive testing is excessive.

In a test mode, multiple memory cell bits or words in the DRAM IC are tested simultaneously, thus reducing test time. In a four megabit DRAM, for example, the DRAM can be internally organized as 4,914,304 words by one bit. In the test mode, data (ones or zeros) can be written into eight sectors in parallel and retrieved in the same way. If, upon reading, all bits are equal (all ones or all zeros), the data output pin (DQ) indicates a one. If any of the bits differed, the data output pin would indicate a zero. In test mode, therefore, the 4M DRAM can be tested as if it were a 512K DRAM, thereby reducing the testing time.

Switching a DRAM IC into test mode can be accomplished by using a combination of input signals that would not be encountered in normal operation. For example, a DRAM can be switched into test mode by inserting WRITE* and CAS* signals before RAS* (WCBR) cycle (where an asterisk indicates a complement or active low signal). Reset is done by a sequence of CAS* before RAS* refresh (CBRR) cycle or RAS* only refresh (ROR) cycle, thereby returning the device to the normal operating mode.

It is also known to switch a DRAM IC device into test mode by using a supervoltage technique. A test function voltage is applied to one of the IC pins (typically called TE, or test mode enable), to trigger the device into a test mode. A typical test function voltage is 4.5 volts higher than the chip supply voltage (Vcc).

But there is a problem using the multiple bit test method, that is, if by chance all of the eight bits were in the wrong state, the output pin would still indicate one since all bits are the same. Therefore, the test is not valid.

This is also a problem with the Joint Electronic Device Engineering Council (JEDEC) Standard 21-C, "DRAM Special Test and Operational Modes", which uses the WCBR cycle to activate special modes. The particular mode is selected by the use of the lower order (A0-A7) address line coding, i.e., A6*, A5*, and A7* to select a JEDEC "registered" test mode, and A6*, A5, and A7* to select a "registered" JEDEC operational mode. A vendor or customer specific mode is selected by A6, A5*, and A7. A0-A4 input signals are used to further define the individual modes within a block.

SUMMARY OF THE INVENTION

In accordance with the present invention, a unique method of testing an integrated circuit dynamic random access memory (DRAM) is provided. The method generally stated, includes enabling the test mode by a Write Enable (WE*) and Column Address Select (CAS*) before Row Address Select (RAS*), and timing signals, as is well known in the art. The expected results of the data that is written into multiple memory cells is also entered (written), for instance, into an expected data register on the DRAMS, four or eight bits at a time.

The expected data is written into the expected data register on each high-to-low state transition of RAS in conjunction with a concurrent Write Enable WE* low signal. The data is read then as described in the JEDEC procedure to see if all bits match and is also compared four bits at a time to the expected data register. If the data again matches, ones (high) will appear on the DQ (data in-out) pins indicating proper data; or, if there is a mismatch, a zero appears on the data out bus.

As with prior art, test mode multiple bits are tested simultaneously. With the method of the invention, however, the state of each bit tested is compared to the expected data. This precludes the possibility of not detecting errors caused by multiple bits being in the same wrong state.

Other objects, advantages, and capabilities of the present invention will become more apparent as the description proceeds.

BRIEF DESCRIPTION OF THE DRAWINGS

FIG. 1 is a test mode entry timing chart;

FIG. 2 is a timing chart for a write data cycle of the present invention;

FIG. 3 is a table of DRAM memory contents during a write cycle in the test mode;

FIG. 4 is a timing chart for a read data cycle in the test mode;

FIG. 5 is a table of DRAM memory contents and output data during a read cycle in the test mode;

FIG. 6 is a timing chart for a read cycle in the test mode using the expected data register of the present inventive method;

FIG. 7 is a memory contents table for a read cycle in the test mode;

DETAILED DESCRIPTION OF THE INVENTION

Figure 8:
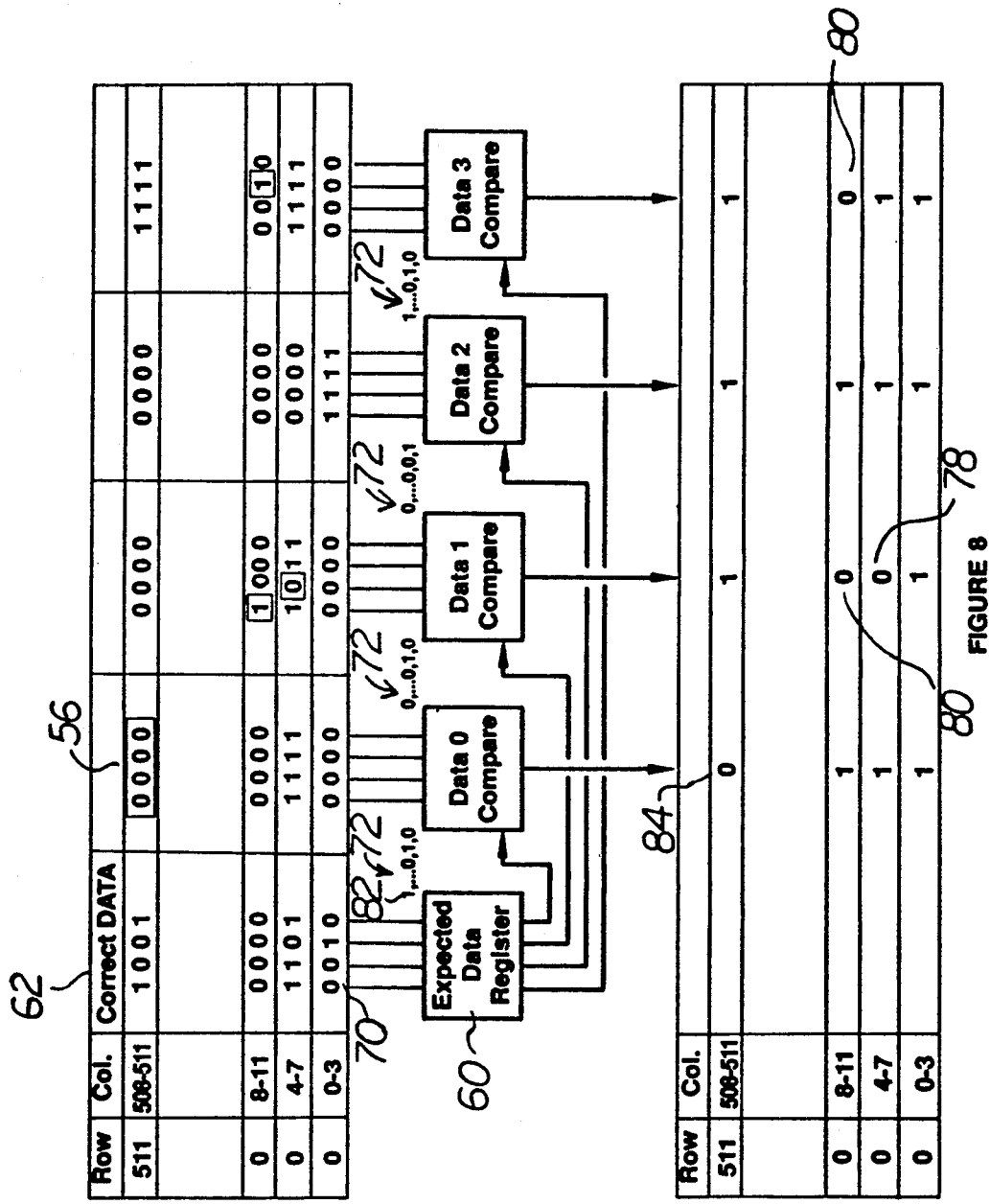
FIG. 8 is an input and output table for a read cycle in the test mode using the expected data register.

The method of the proposed test mode can be understood by referring to FIGS. 1-8. In FIG. 1, the test mode is entered in the manner outlined by the Joint Electronic Device Engineering Council (JEDEC) standard 21-c. In this method, a WCBR cycle is performed with the correct address to initiate a specific test mode. The test mode 8 is entered as shown in FIG. 1, since a low CAS* 10 and WE* 12 is followed by a RAS* 14 low in conjunction with a correct address signals at 16 and 18. Other test mode entry schemes, such a supervoltage (higher than Vcc) on a signal pin, are also possible.

The DRAM will not exit the test mode until a CBRR or RAS Only Refresh (ROR) cycle occurs.

Once in the test mode, all DRAM cell locations can be written using normal write cycles. However, since the DRAM is in test mode, several cell locations are written simultaneously. For this example, a 256K×4 bit wide (1 Megabit) DRAM will be used with a 4× test mode. The 4× test mode indicates that the data will be written to four columns of each of four memory subarrays simultaneously. Thus, 16 cell locations will be written simultaneously instead of 4, which results in a 4 times reduction in test write time. This operation is partially shown in FIGS. 2 and 3. The RAS* low signal 20 selects a row, based on address signal 21, i.e. ROW "0" and at CAS* low 22 with WE* 24, the columns "0–3" are simultaneously selected and written with data (in) 26 as shown in memory contents table 28. The second group of columns are written at 30 into columns 4–7 and so forth until the last row 511 and last columns 508–511 are written at 32; and each of the four subarray memory cells are filled with a data bit.

After the DRAM cell locations have been written, the entire DRAM contents can be read in the test mode. During the test mode read, 4 cell locations (per data bit) are read simultaneously which results in a 4× reduction of the read time. In the JEDEC standard 21-C, the 4 cell locations, one column in each subarray for each data bit are compared with each other to determine if all locations match. If they all match, that data bit will output a "one" indicating no error has occurred.

FIGS. 4 and 5 show the operation of the JEDEC standard test mode during read cycles. The read cycle has been enabled by WE* being high while CAS* is low and output is enabled by OE* being low at 36; and data out is indicated at 48. This "data out" line indicates the results of the JEDEC compare operation. The "output after data compare" are also shown in the memory contents table. Assume that the memory contents are the same as was written in FIG. 2 except for a few internal errors. These errors have been highlighted by boxes in the FIG. 5. Four cases have been shown: no errors at table section 40, an error in one data bit at 42, an error in two data bits at 44, and one data bit has all locations incorrect at 46. Note that in the first case (row 0, column 0–3), all DATA outputs are ones at 48. In the second case (row 0, column 4–7), the data bit with an error (DATA 1) outputs a zero at 50. In the third case, two data bits have an error at 52, and two zeros result at the output. Case four shows the example where the JEDEC test mode fails to detect an error. The input data for DATA0 should have been four ones; however, four zeros appears in the memory cells at 56. Since all locations match, a one is output, indicating that there are no errors. This has been highlighted by the box at 58 in the table.

Referring to FIGS. 6–8 in the present invention, the test mode is entered and data is written to the DRAM in the same manner as the JEDEC test mode. However, a register 60 is used in the DRAM to store the correct data 62 appearing on the data lines when RAS* transitions low at 64, while WE* is low at 66. Normally, the data bit is ignored at the high-to-low transition of RAS*. With this technique, expected data can be loaded into the register at the beginning of the read cycle. This data can be compared with the cell locations to verify that all cells match the expected data. The expected data will be the data that was originally written into the DRAM at that address location.

FIGS. 6, 7, and 8 illustrate the operation of this unique test mode. Assume that the DRAM was written with the same data as FIG. 3 and contained the same errors in boxes as FIG. 5. The first four bits 68 on the data bus are written into expected data register 60 as indicated at 70. The correct bits 72 are compared to the corresponding data compare subarray 0, 1, 2, and 3; and, if data matches, ones appear on data (out) bus as at 74 as a result of the OE* signal low 76 while CAS* is low.

The data input and testing continues as before and again the output properly indicates errors in row 0, columns 4–7 and 8–11 as indicated by zeros in data out at 78 and 80.

The results of the last test, however, are different as a result of the expected data register bit compare action of bit 82 with subarray 0, where the "one" doesn't match the incorrect zeros and output of the Subarray DATA 0 compare is 0 as at 84, indicating an error overlooked by the previous JEDEC test.

Some DRAMs incorporate a write-per-bit mask or masked write function. With this function, a mask register is loaded from the data bus when WE* is low at the RAS* high-to-low transition. The mask data in the normal mode is used to disable writes to certain data bits. This bit mask register can be used for the expected data register in the test mode for devices which have the masked write feature.

Figure 9:
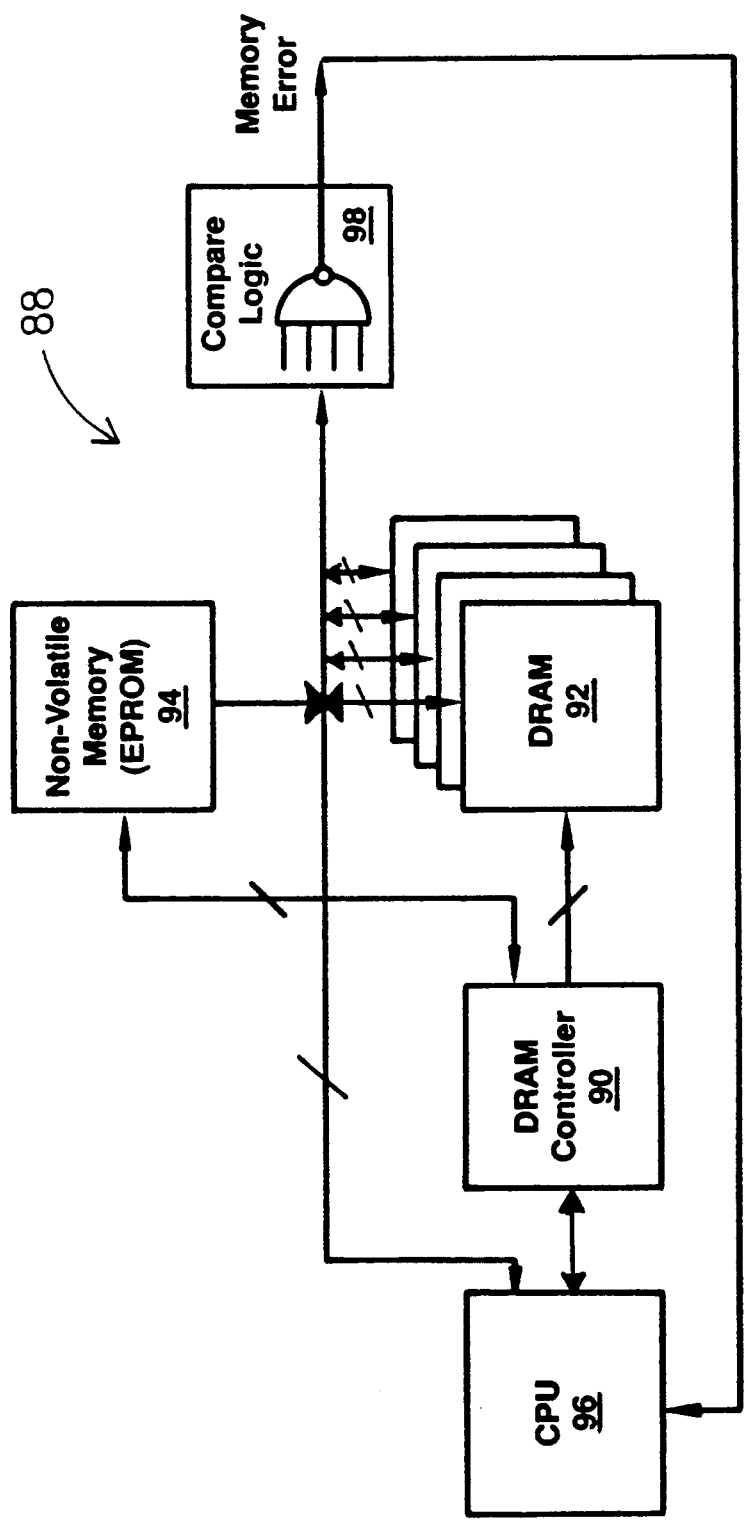
FIG. 9 illustrates a system that uses the present invention test method.

Personal computers can use this test mode to perform memory function tests (usually after the computer is first turned on). FIG. 9 shows how a personal computer 88 would be organized to use this test mode. In this figure, the DRAM controller 90 provides the clocking and address signals to control the DRAM 92 as in most computers. However, the controller 90 will also provide clocking and address signals to control an erasable programmable read-only memory 94 (EPROM) or other non-volatile memory. This memory contains the data to be written to the DRAM 92. Upon power-up, the DRAM controller 90 will initialize the test mode and the entire contents of the EPROM will be read while writing to the DRAM. This will continue until all DRAM locations have been written.

The entire EPROM contents will be read again, but the PROM data will be loaded into the DRAM each cycle with WE* low at the RAS* high-to-low transition. DRAM read cycles will be performed which incorporate the expected data compare. The data bus needs only to be monitored when CAS* is low to look for the presence of a zero. If a zero exists, then a memory error has occurred, and the central processing unit (CPU) 96 will be notified by the compare logic 98.

This invention can also be used for video RAMs. This invention is not dependent upon the way the test mode is entered or exited but is dependent upon the expected data register and compare logic and the manner in which the test mode operates.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of testing an integrated circuit DRAM comprising:

a. entering a test mode;

b. writing data bits to a plurality of DRAM cells within multiple subarrays;

c. writing the data bits to a multiple-cell mask register within the DRAM during a read cycle, thereby using the mask register as an expected data register while in test mode;

d. reading data from each subarray cell and comparing the data bits to each other and to the mask register to verify that all cells match each other and the mask register;

whereby incorrect stored data within the cells of the cell subarray may be detected.

2. The method as recited in claim 1 and wherein a one on an output data bus indicates a test success and a zero indicates a test failure.

3. The method as recited in claim 1 and wherein entry into the test mode is via a standard JEDEC test mode entry.

4. A method of testing an integrated circuit DRAM, the DRAM comprises four subarrays having 512 rows by 512 columns, and writing to the memory cells is performed in multiples of 16 cells at a time, the method comprising the steps of:

initiating entry to a test mode;

performing a write operation to write data bits to a row, multiple columsn, and multiple subarrays;

writing multiple data bits to a mask write register within the DRAM, thereby using the mask register as an expected data register while in test mode;

whereby the mask write register comprises four cells and data is written into the register on a RAS* low signal in conjunction with a WE* low signal;

comparing the data bits in the subarray columns to each other and to the mask write register to check for a match in data bits;

outputting a zero to a data bus if data bits do not match each other and the mask write register; and then outputting a one digit to a data bus if the column data bits match each other and the mask write register, and wherein a one on the data bus indicates test success and a zero indicates a test failure.

5. A method of self testing a personal computer DRAM memory array comprising:

turning on power to the computer;

initiating entry to a test mode by applying a WE* low signal and a CAS* before RAS* signal in conjunction with application of a specific address signal;

providing a clocking and address signal from a DRAM controller to the DRAM array and to an erasable programmable read-only memory (EPROM);

writing all data bits of the EPROM into the DRAM until all DRAM rows, columns, and subarray memory cells have been filled;

writing the correct data to a mask write register within the DRAM, thereby using the mask register as an expected data register while in test mode;

comparing the data bits in the columns to check for a match in data bits in a compare logic circuit;

outputting a zero to a central processing unit (CPU) if the data bits do not match;

outputting a one digit to the CPU if the column data bits match each other and if the column data bits match the mask write register bits; and then monitoring of the data bus by the CPU during a CAS* low signal, for detecting the presence of a zero indicating a memory error.

6. In a JEDEC test mode for a DRAM, an improved test method, the improvement comprising the steps of:

writing data bits to a plurality of DRAM cells within multiple subarrays;

writing data bits to a mask write register within the DRAM during a read cycle, thereby using the mask register as an expected data register while in test mode;

reading data from each subarray cell;

comparing the subarray data bits to each other and to the mask write register;

outputting a one digit to a data bus if the column bits match each other and the mask write register thereby indicating a test success; and then outputting a zero digit if data bits do not match each other or a data bit does not match the mask write register thereby indicating a test failure.

* * * * *